United States Patent
Liang et al.

(10) Patent No.: US 11,172,300 B2
(45) Date of Patent: Nov. 9, 2021

(54) SOUND PRODUCING DEVICE

(71) Applicant: xMEMS Labs, Inc., Santa Clara, CA (US)

(72) Inventors: Jemm Yue Liang, Sunnyvale, CA (US);
Hsi-Sheng Chen, Fremont, CA (US);
Chiung C. Lo, San Jose, CA (US);
Wen-Chien Chen, New Taipei (TW);
Chun-I Chang, Hsinchu County (TW);
Hao-Hsin Chang, New Taipei (TW)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 17/153,849

(22) Filed: Jan. 20, 2021

(65) Prior Publication Data
US 2021/0250689 A1   Aug. 12, 2021

Related U.S. Application Data

(60) Provisional application No. 63/112,860, filed on Nov. 12, 2020, provisional application No. 63/105,286,
(Continued)

(51) Int. Cl.
*A61F 11/06*       (2006.01)
*G10K 11/16*       (2006.01)
(Continued)

(52) U.S. Cl.
CPC .............. *H04R 3/14* (2013.01); *B81B 3/0021* (2013.01); *G10K 11/178* (2013.01);
(Continued)

(58) Field of Classification Search
CPC .......... H04R 3/14; H04R 1/1075; H04R 1/26; B81B 3/0021; G10K 11/178
See application file for complete search history.

(56) References Cited

U.S. PATENT DOCUMENTS

2010/0119097 A1   5/2010   Ohtsuka
2014/0247698 A1*  9/2014   Dirksen ............... H04R 31/00
                                                                367/189
(Continued)

FOREIGN PATENT DOCUMENTS

GB      2 335 820 A      9/1999
KR   10-2012-0056020 A   6/2012
(Continued)

*Primary Examiner* — Simon King
(74) *Attorney, Agent, or Firm* — Winston Hsu

(57) ABSTRACT

A sound producing device includes a first sound producing cell, driven by a first driving signal and configured to produce a first acoustic sound on a first audio band, and a second sound producing cell, driven by a second driving signal and configured to produce a second acoustic sound on a second audio band different from the first audio band. A first membrane of the first sound producing cell and a second membrane of the second sound producing cell are Micro Electro Mechanical System fabricated membranes. The first audio band is upper bounded by a first maximum frequency; the second audio band is upper bounded by a second maximum frequency. A first resonance frequency of the first membrane is higher than the first maximum frequency of the first driving signal. A second resonance frequency of the second membrane is higher than the second maximum frequency of the second driving signal.

30 Claims, 10 Drawing Sheets

Related U.S. Application Data filed on Oct. 24, 2020, provisional application No. 62/971,364, filed on Feb. 7, 2020.

(51) Int. Cl.

| | | |
|---|---|---|
| *H03B 29/00* | (2006.01) | |
| *H04R 3/14* | (2006.01) | |
| *H04R 19/02* | (2006.01) | |
| *H04R 7/04* | (2006.01) | |
| *G10K 11/178* | (2006.01) | |
| *H04R 1/10* | (2006.01) | |
| *B81B 3/00* | (2006.01) | |
| *H04R 1/26* | (2006.01) | |

(52) U.S. Cl.
CPC ............ *H04R 1/1075* (2013.01); *H04R 1/26* (2013.01); *H04R 7/04* (2013.01); *H04R 19/02* (2013.01); *B81B 2201/0257* (2013.01); *B81B 2203/0127* (2013.01); *B81B 2207/03* (2013.01); *G10K 2210/1081* (2013.01); *H04R 2201/003* (2013.01)

(56) References Cited

U.S. PATENT DOCUMENTS

| | | | |
|---|---|---|---|
| 2016/0286319 A1* | 9/2016 | Kupershmidt | ......... H04R 19/02 |
| 2017/0041708 A1* | 2/2017 | Barzen | ................. H04R 19/005 |
| 2017/0201192 A1* | 7/2017 | Tumpold | .............. H01L 41/081 |
| 2021/0058011 A1* | 2/2021 | Seshia | ................. H01L 41/1138 |
| 2021/0067880 A1* | 3/2021 | Cheng | ................... B81B 3/0021 |

FOREIGN PATENT DOCUMENTS

| | | |
|---|---|---|
| WO | 2017/068711 A1 | 4/2017 |
| WO | 2018/195230 A1 | 10/2018 |

* cited by examiner (a)

(b)

(a)

(b)

SOUND PRODUCING DEVICE

CROSS REFERENCE TO RELATED APPLICATIONS

This application claims the benefit of U.S. provisional application No. 62/971,364, filed on Feb. 7, 2020, U.S. provisional application No. 63/105,286, filed on Oct. 24, 2020, and U.S. provisional application No. 63/112,860, filed on Nov. 12, 2020, which are incorporated herein by reference.

BACKGROUND OF THE INVENTION

1. Field of the Invention

The present application relates to a sound producing device, and more particularly, to a sound producing device capable of enhancing design flexibility and/or sound quality.

2. Description of the Prior Art

A Micro Electro Mechanical System (MEMS) speaker normally employs only one type of membrane to cover the entire audible/hearing range, and therefore the maximum input frequency of an input signal generally equals the maximum human audible frequency, which is typically about 15~17 Kilohertz (KHz) for adults. These can limit the design flexibility and/or sound quality of a MEMS speaker.

SUMMARY OF THE INVENTION

It is therefore a primary objective of the present application to provide a sound producing device capable of enhancing design flexibility and/or sound quality.

An embodiment of the present application discloses a sound producing device (SPD). The SPD comprises a first sound producing cell comprising a first membrane, driven by a first driving signal, configured to produce a first acoustic sound on a first audio band; and a second sound producing cell comprising a second membrane, driven by a second driving signal, configured to produce a second acoustic sound on a second audio band different from the first audio band; wherein the first membrane and the second membrane are Micro Electro Mechanical System, abbreviated as MEMS, fabricated membranes; wherein the first audio band corresponding to the first driving signal is upper bounded by a first maximum frequency, and the second audio band corresponding to the second driving signal is upper bounded by a second maximum frequency; wherein a first resonance frequency of the first membrane is higher than the first maximum frequency of the first driving signal; wherein a second resonance frequency of the second membrane is higher than the second maximum frequency of the second driving signal.

Another embodiment of the present application discloses a crossover circuit, disposed within a sound producing device (SPD), wherein the SPD comprises a first sound producing cell driven by a first driving signal and a second sound producing cell driven by a second driving signal, the crossover circuit comprising a first filter, receiving an input signal at an input terminal of the first filter; and a first subtraction circuit, wherein a first input terminal of the first subtraction circuit is coupled to the input terminal of the first filter, a second input terminal of the first subtraction circuit is coupled to an output terminal of the first filter; wherein the crossover circuit produces the first driving signal according to a first output signal of the first subtraction circuit; wherein the crossover circuit produces the second driving signal according to a second output signal of the first filter.

Another embodiment of the present application discloses a sound producing cell, comprising a membrane comprising a first membrane subpart and a second membrane subpart; wherein only one edge of each of the first membrane subpart and the second membrane subpart is anchored, and other edges of each of the first membrane subpart and the second membrane subpart are released.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
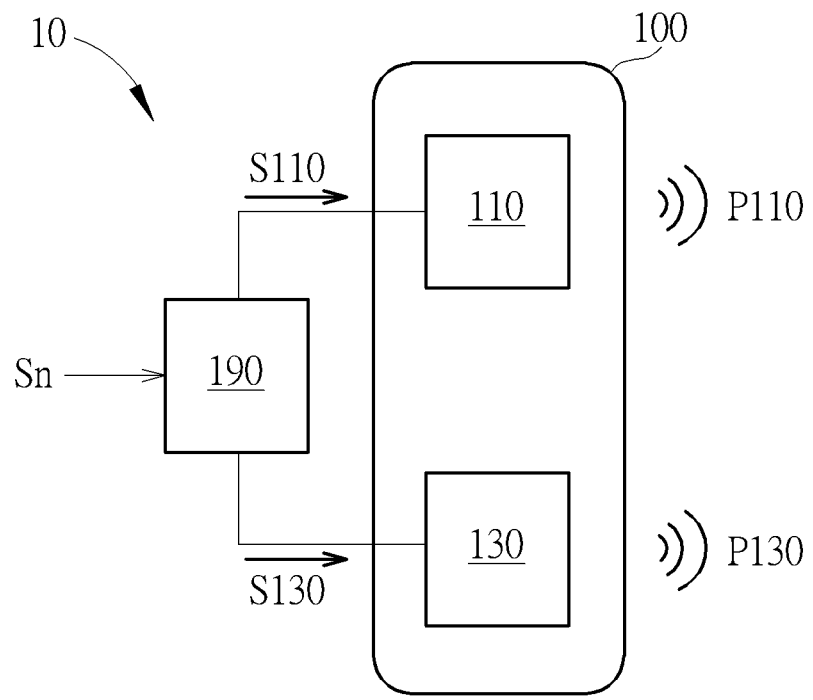
FIG. 1 is a schematic diagram of an SPD according to an embodiment of the present application.

FIG. 1 is a schematic diagram of a sound producing device (SPD) 10 according to an embodiment of the present application. The SPD 10 may be a MEMS microspeaker or a MEMS speaker, a speaker fabricated via the MEMS fabrication technology or MEMS fabrication process. The SPD 10 may be applied in applications such as wearable device, headphone, (in-ear or on-ear) headset or earpiece, hearing aids, etc.

The SPD 10 may include a sound generating/producing cell array 100. The cell array 100 includes a plurality of sound producing cells, which may be divided into different categories: for example, sound producing cell(s) 110 specialized in generating sound of higher register (P110) and sound producing cell(s) 130 specialized in generating sounds of lower register (P130), as such, the resonance frequency of the sound producing cell 110 may be higher than that of the cell 130.

The SPD 10 may also include a crossover circuit 190. The crossover circuit 190, receiving an input signal Sn, is configured to partition an entire audio band corresponding to the input signal Sn into a first audio band corresponding to a driving signal S110 and a second audio band corresponding to a driving signal S130, and outputs the driving signals S110 and S130 to the sound producing cells 110 and 130, respectively. In an embodiment, the frequency/audio band/sub-band of the driving signal S130 may be different from, or complementary to, that of the driving signal S110.

Figure 2:
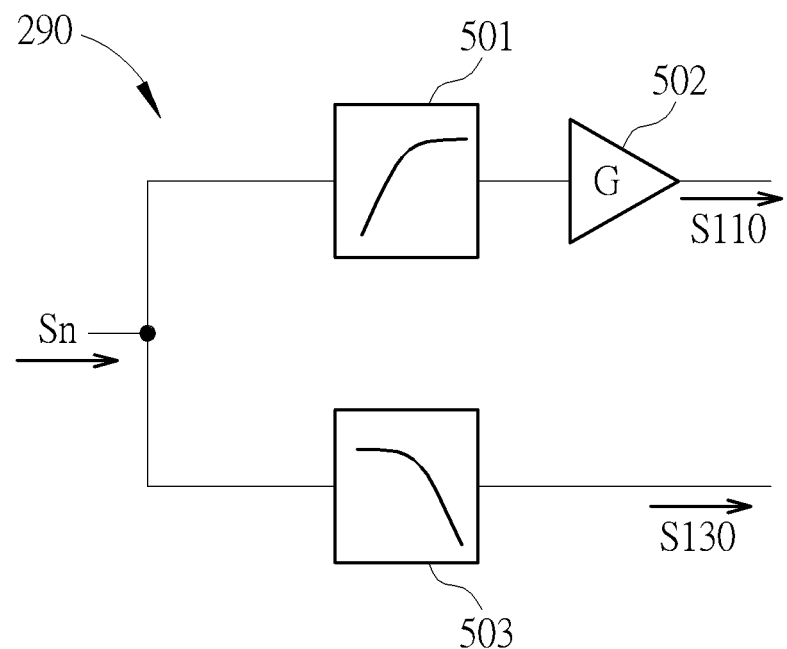
FIG. 2 is a schematic diagram of a crossover circuit according to an embodiment of the present application.

Specifically, FIG. 2 is a schematic diagram of a 2-way crossover circuit 290 according to an embodiment of the crossover circuit 190. The crossover circuit 290 may include a high-pass filter (HPF) 501 and a low-pass filter (LPF) 503 connected in parallel to the input signal Sn and split the input signal Sn into the driving signal S110 for the high frequency sound producing cell 110 (tweeter) using the HPF 501 and the driving signal S130 for the low frequency sound producing cell 130 (woofer) using the LPF 503.

Figure 3:
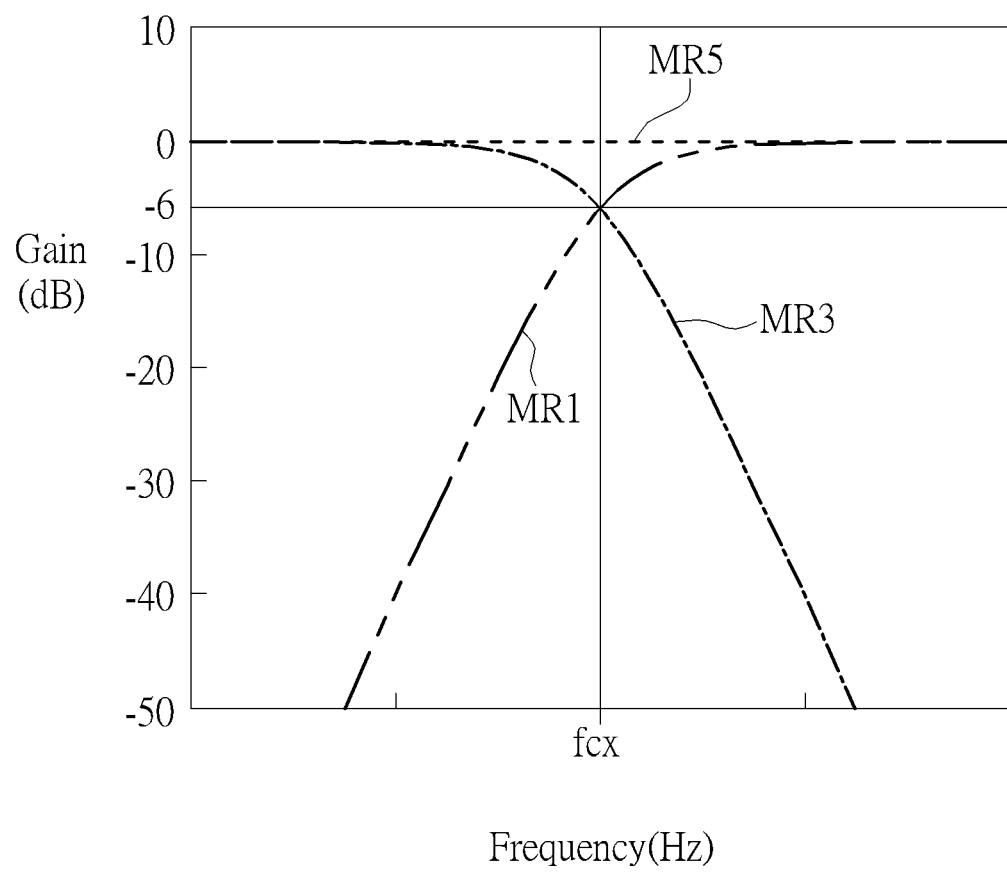
FIG. 3 is a schematic diagram of the frequency response corresponding to the crossover circuit according to an embodiment of the present application.

FIG. 3 is a schematic diagram of the amplitude frequency response corresponding to the crossover circuit 290. As shown in FIG. 3, the frequency response MR1 of the HPF 501 and the frequency response MR3 of the LPF 503 intersect at a crossover frequency fcx at their respective −6 dB points. The crossover frequency fcx may, or preferably, fall between 800 Hz to 4 KHz, approximately the range of the frequency where human hearing is the most sensitive, so as to divide the workload of sound production equitably between cells 110 and cells 130. In an embodiment, the HPF 501 and the LPF 503 both have −6 decibel (dB) roll-off at the cross-over frequency fcx. As illustrated in FIG. 3, as a result, the frequency response MR5 of the combined output from crossover circuit 290 will be flat over the entire frequency range.

In FIG. 2, the crossover circuit 290 may further includes a gain circuit (or sensitivity compensation block) 502 configured to compensate for difference in the sensitivities between the sound producing cells 110, 130.

Figure 4:
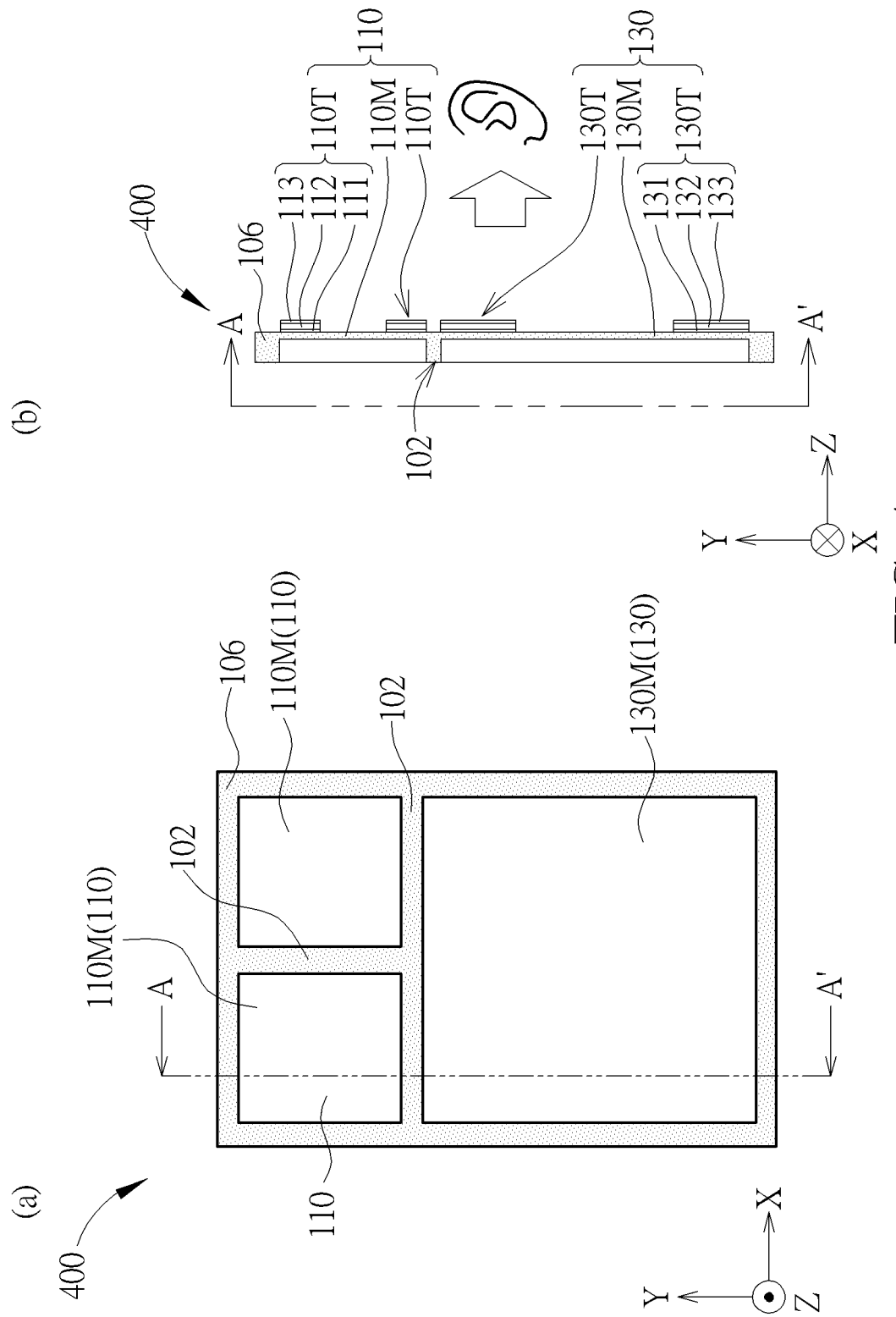
FIG. 4 is a schematic diagram of a cell array according to an embodiment of the present application.

FIG. 4 is a schematic diagram of a sound generating/producing cell array 400 according to an embodiment of the present application. FIG. 4a illustrates a top view of the cell array 400. FIG. 4b illustrates a cross-sectional view taken along a cross-sectional line A-A' shown in FIG. 4a. The cell array 100 of FIG. 1 may be implemented as the cell array 400 of FIG. 4. The cell array 400 includes two sound producing cells 110 and one sound producing cell 130, each defined by one (MEMS) membrane 110M or 130M.

As shown in FIG. 4a, the area of each membrane 130M is larger than that of each membrane 110M, resulting in the resonance frequency of the membrane 130M being lower than that of the membrane 110M.

As shown in FIG. 4b, the sound producing cell 110 may further include at least one actuator 110T attached/disposed on the membrane 110M. The actuator 110T may be a thin film actuator such as a piezoelectric actuator, which includes electrodes 111, 113 and a material 112 (e.g., piezoelectric material) sandwiched between the electrodes 111, 113. In an embodiment, the material 112 may be made of thin-film piezoelectric material(s) such as PZT (lead zirconate titanate). The driving signal S110 is applied across the electrodes 111 and 113 to cause the deformation of the material 112, such that the membrane 110M deforms to produce movement in the Z direction and generate the (acoustic) sound/pressure P110.

In an embodiment, the sound producing cell 110 may function as tweeter to cover the frequency band above the crossover frequency fcx, and will not be required to produce high output for frequency significantly below the crossover frequency fcx (e.g., 1.44 KHz). In addition, the resonance frequency of the sound producing cell 110 (or the membrane 110M therein), denoted as $f_{r,110}$, may be significantly higher than a maximum frequency of the driving signal S110, denoted as $f_{max,S110}$, or the maximum input audio frequency, e.g., 15 KHz or 20 KHz, where the first audio band may be upper bounded by $f_{max,S110}$. The resonance frequency $f_{r,110}$ of the sound producing cell 110 may be, for example, around 18 KHz or 23 KHz. In an embodiment, the resonance frequency of the sound producing cell 130 (or the membrane 130M therein), denoted as $f_{r,130}$, may be significantly higher than the maximum frequency of the driving signal S130, denoted as $f_{max,S130}$, where the second audio band may be upper bounded by $f_{max,S130}$. As disclosed in U.S. provisional application No. 62/897,365 and/or U.S. Pat. No. 10,805,751, the resonance frequency being significantly higher than the maximum frequency of the driving signal represents that, the resonance frequency is at least higher than the maximum frequency of the driving signal plus a half of a resonance bandwidth, i.e., $\Delta f/2$, a.k.a., HWHM (half width at half maximum), which is incorporated herein by reference.

In one aspect of the present invention, the SPD 10 includes the (2-way) cell array 100 where multiple membrane designs may be employed to cover the overall frequency spectrum to be produced by the SPD 10. The sound producing cells 110 and 130 may be driven by the output of the crossover circuit 190, which partitions the frequency spectrum of the input signal Sn into two (or more) complementary audio bands.

In addition, as illustrated in FIG. 4, the sound producing cell 130 may also include at least one actuator 130T. The driving signal S130 is applied across electrodes 131 and 133 of the actuator 130T to cause the deformation of a material 132 of the actuator 130T, such that the sound/pressure P130 is generated by the Z direction movement of membrane 130M. In an embodiment, the sound producing cell 130 may function as a woofer to cover frequency below the crossover frequency fcx.

In an embodiment, the resonance frequency of the sound producing cell 130 may be higher than the crossover frequency fcx of the crossover circuit 190 and therefore comply with the condition as disclosed in U.S. provisional application No. 62/897,365 and/or U.S. Pat. No. 10,805,751. The frequency at which the driving signal S130 is decayed by 40 dB, in the case of a 4th order crossover, may be roughly calculated as $100^{1/4} \cdot \text{fcx}$. Therefore, as an example, for cross-over frequency fcx=1.44 KHz, the resonance frequency $f_{r,130}$ of the sound producing cell 130, may be $100^{1/4} \cdot \text{fcx} \cong 4.55$ KHz (which may be expressed as $f_{r,130}$=4.55 KHz). Assuming, in a particular embodiment of the present invention, the resonance frequencies of the sound producing cells 110 and 130 are 23 KHz and 4.55 KHz, respectively, then the ratio of resonance frequencies between cell 110 and cell 130 is 23 KHz/4.55 KHz=5 times. Note that, within the SPD of the present application, the cross-over frequency fcx and the resonance frequencies $f_{r,110}$ and $f_{r,130}$ have a relation of $\text{fcx}<f_{r,130}<f_{r,110}$ (eq. 1). In addition, supposed that $f_{max,S110}$ denotes a maximum frequency of the driving signal S110 (e.g., 15 KHz or 20 KHz), the relation in eq. 1 may be further extended to $\text{fcx}<f_{r,130}<f_{max,S110}<f_{r,110}$ (eq. 2).

By lowering membrane resonance frequency, the stiffness of membrane can be lowered to enhance the membrane-displacement-per-unit-area-of-silicon (namely, $\Delta U_{Z\_AVE}/\text{mm}^2$, where $\Delta U_{Z\_AVE}$ represents the average membrane displacement). In practice, the empirical equation of $A \times \Delta U_{Z\_AVE} \propto 1/f_r$ is usually observed, where A represents the membrane area of each cell, $f_r$ represents the resonance frequency of the membrane. In other words, for similar membrane design patterns (for instance, one of the membrane patterns 310~330 of FIG. 5, which would be elaborated later), the $\Delta U_{Z\_AVE}/\text{mm}^2$ of a cell with a resonance frequency of 4.55 KHz could be 5 times higher than that of a cell with a resonance frequency of 23 KHz.

In FIG. 4a, there may be no slit in the membrane 110M or 130M. In another embodiment, the membrane 110M or 130M may have slit(s) to form a slit pattern on the membrane 110M or 130M, and the slit pattern of the membrane 110M may be different from that of the membrane 130M. The term "slit" refers to a fine line cutting through the thickness of the membrane. The width of slits is generally very narrow, typically 0.8~3 micrometers (μm), but not limited thereto. The pattern of slits affects the stiffness of the overall membrane and, therefore, the resonance frequency of the membrane. Generally speaking, for a given membrane surface area, the longer the total length of the slits is, the softer the membrane will be and the lower the resonance frequency will be. In other words, among membranes with similar slit pattern, there will be a correlation between L (the total length of the slits), A (the area of membrane) and $f_r$ (the resonance frequency), which may be expressed as $$f_r \propto \frac{1}{A \cdot L}.$$

In addition to the length L of the slits, the location and the orientation of the slits, i.e., the pattern of the slits, also play an important role in determining the stiffness of the membrane and therefore affect the resulting resonance frequency.

In an embodiment, the ratio of the total length of the slit(s) to the area of the membrane 110M is different from that of the membrane 130M. In an embodiment, the pattern of the slit(s) on the membrane 110M is different from that on the membrane 130M.

Figure 5:
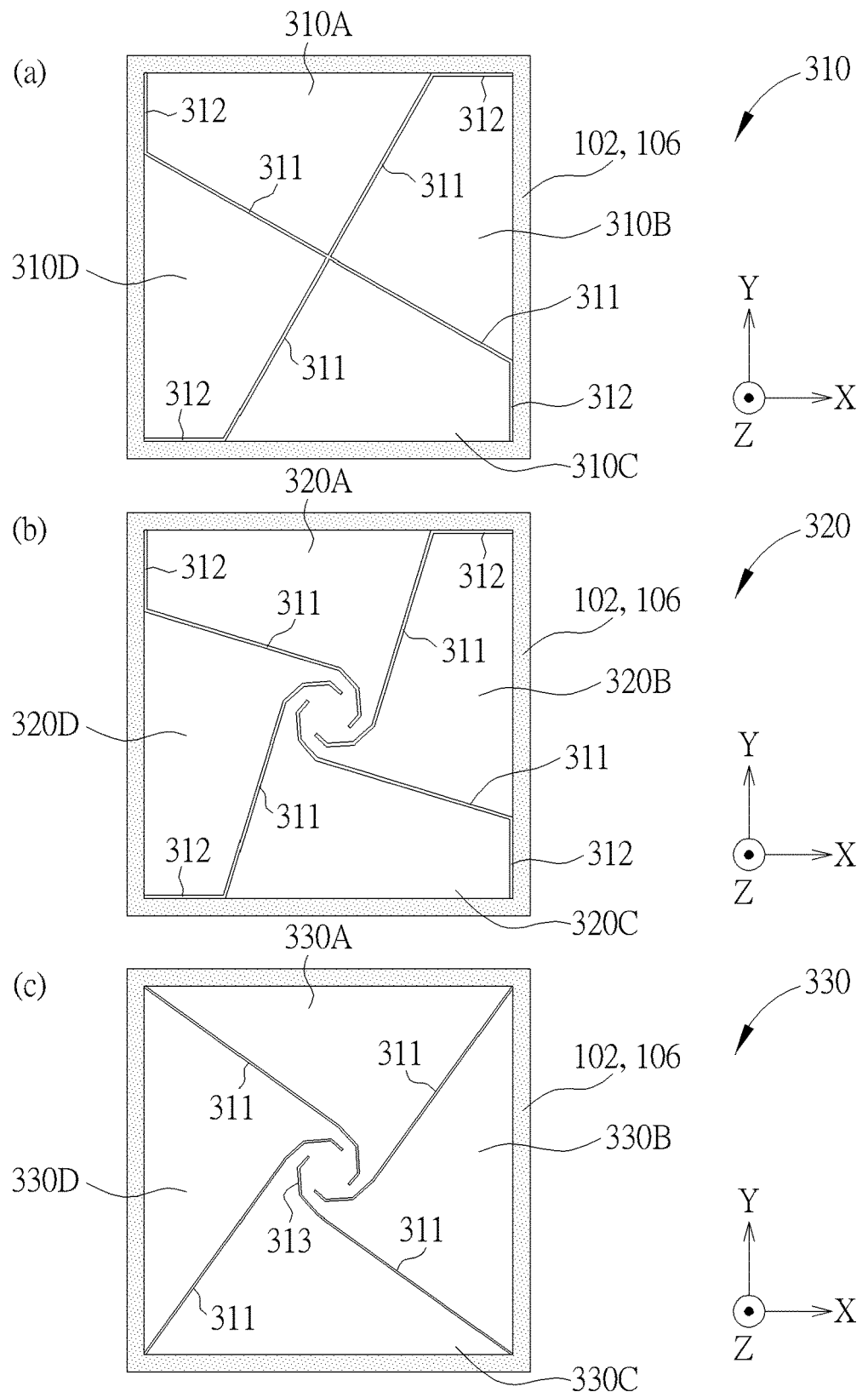
FIG. 5 and FIG. 6 are schematic diagrams of the membrane patterns according to an embodiment of the present application respectively.

For instance, FIG. 5 is a schematic diagram of three membrane patterns 310-330, which have different degrees of freedom of movement (in the Z direction) respectively, which may be utilized in different embodiments of the present application. FIG. 5a illustrates a top view of the membrane pattern 310. FIG. 5b illustrates a top view of the membrane pattern 320. FIG. 5c illustrates a top view of the membrane pattern 330. Membranes (e.g., the membrane 110M or 130M) may be etched by suitable MEMS fabrication processes to form slit(s) (each includes slit openings/segments 313, 311, or 312 arranged from the inside to the outside) and create the membrane patterns 310-330 of rotational symmetry. The term "membrane pattern" refers to the resulting membrane with pattern of slit(s) cutting through the thickness of the membrane.

The membrane pattern 330 has the lowest degrees of freedom among the three membrane patterns in FIG. 5. Compared to membrane pattern 330, in membrane pattern 320, four slit segments 312 are disposed coinciding with the four boundary edges of the membrane, starting from the four corners of the membrane, partially freeing the boundary edges as a result. By increasing the degree of freedom of the (membrane) movement along the (cell) boundary edges, these four slit segments 312 of membrane pattern 320 (and 310) increases the efficacy of actuator(s) on membrane 320 (and 310). In addition to the degree of freedom of the membrane, slit segments 312 also reduce the stiffness of the membrane and therefore further increase the amount of $\Delta U_{Z\_AVE}/\text{mm}^2$. In summary, compared to membrane pattern without slit openings/segments on the boundary edges (such as membrane pattern 330), membrane patterns with slit openings/segments along the (membrane) boundary edges (such as membrane patterns 310 and 320) will have increased degrees of freedom of movement and will produce higher $\Delta U_{Z\_AVE}/\text{mm}^2$.

Among the membrane patterns of FIG. 5, membrane pattern 310 has the highest degrees of freedom, since four membrane subparts 310A-310D constituting the membrane (e.g., the membrane 110M) are not bounded to one another at the center of the membrane pattern and are able to move freely along the slit openings/segments 311 and 312.

However, air may flow through the slit(s) around the location with the maximum membrane displacement near the center of the membrane. For example, at the peak of the membrane displacement of the membrane pattern 310, dislocations disjointing at the center between the membrane subparts 310A-310D may occur, and air may pass through the dislocations, resulting in the drop in sound pressure level (SPL). According to Newton's law, the amount of airflow is proportion to $t^2$ according to the equation $D=(a \cdot t^2)/2$, where D, a, and t represent the membrane displacement, acceleration, and time, respectively. As a result, the higher the operating frequency of one membrane is, the less the impact of the airflow due to the dislocations of the membrane would be. In other words, the membrane pattern 310 with potential dislocations may be used to produce sound of higher frequency and should be avoided when producing sound of lower frequency.

There are two factors in improving $\Delta U_{Z\_AVE}/\text{mm}^2$: lower resonance frequency, and/or increased degree of freedom of membrane movement. The focus of cell 110 is on the improvement of membrane movement with the increased degree of freedom instead of the resonance frequency. The focus of cell 130 is on the improvement of membrane movement with lower resonance frequency.

Because of the short time period (and therefore short t), the leakage through the slit(s) at frequency above crossover frequency fcx will be low and the effect may be largely ignored, the membrane pattern adopted for the membrane 110M of (tweeter) cell 110 may allow higher degrees of freedom. In an embodiment, a membrane pattern with higher degrees of freedom, such as 310 or 320, may be applied to the cell 110 which may improve the $\Delta U_{Z\_AVE}/\text{mm}^2$ by 1.5~2 times.

On the other hand, the cell 130 does need to cover the sound production all the way down to 20 Hz, so the leakage caused by airflow through the slit(s) may no longer be glossed over. The cell 130 may adopt a low-air-leakage membrane pattern where the gaps between membrane subparts (e.g., membrane subparts 320A-320D or 330A-330D) are maintained throughout the transitions of membrane displacement, at the expense of lower degrees of freedom and lower $\Delta U_{Z\_AVE}/\text{mm}^2$. In other words, the lower the reach of the sound producing frequency range of a membrane is, the lower the allowed air leakage through the slits of the membrane, which generally leads to lower degrees of freedom, is. Compared to slit pattern 310, slit patterns 320 and 330 of FIG. 5 both have lower disjoints among membrane subparts because of the membrane subparts are jointed together at the center of the membrane and therefore is suitable for the membrane 130M.

In one aspect of the present invention, by splitting the frequency/audio band of the input signal Sn into multiple audio bands, each cell (110 or 130) can be optimized according to the audio band of the (received) signal (S110 or S130), so as to balance factors such as the resonance frequency, compliance (e.g., stiffness), degrees of freedom, and/or air leakage.

By dividing the input signal Sn into the driving signals S110 and S130, around the frequency band (approximately between 900 Hz to 4 KHz) where human hearing is the most sensitive, the discrepancy between an in-ear-monitor (IEM) speaker and a free-field speaker may be mitigated, such that the SPL requirements may be lowered/relaxed. Specifically, unlike a free-field speaker where its membrane displacement D and the frequency of sound f has a relationship of $D \propto 1/f^2$, in an IEM speaker, assuming insignificant air leakage, the membrane displacement D corresponding to the same SPL is largely independent of frequency for frequency below roughly 900 Hz due to the sealed-chamber compression mode of operation. In other words, when the IEM speaker produces a 10-tone signal from 100 Hz to 3 KHz, each tone may cause the same membrane displacement D; on the other hand, the free-field speaker may cause much less membrane displacement for notes of higher register. Consequently, when playing real music, a free-field speaker having a maximum SPL output of 100 dB/1m at 100 Hz may sound much louder than the IEM speaker having a maximum SPL output of 100 dB at 100 Hz. To compensate for this discrepancy, in an embodiment, about 12-15 dB is added for the maximum SPL requirement of the IEM driver; in other words, the IEM driver may have the maximum SPL requirement of 112-115 dB at 100 Hz instead of 100 dB. In another embodiment, the input signal Sn is partitioned into the driving signals S130 and S110 by crossover circuit 190; therefore, there may be 4-6 dB deduction from the SPL requirements due to separating the requirement membrane displacement into two different groups of sound producing cells 110 and 130, such that the maximum SPL requirement of the group of cell 110 or 130 serving as the IEM speaker may be reduced from 115 dB to 110-112 dB.

By dividing the frequency/audio band of the input signal Sn into multiple audio bands, power consumption for producing the sound/pressure P110 or P130 may also be reduced. Specifically, for piezoelectric material driven MEMS microspeakers, the power consumption is linearly proportional to the frequency of the sound produced multiplied by the area of actuator such as 110T and 130T. After the input signal Sn is split into the driving signals S110, S130 of different/complementary audio bands, the driving signals S110, S130 are channeled to the cells 110, 130 respectively, driving only their corresponding membrane actuators and thereby reducing the power consumption.

Figure 6:
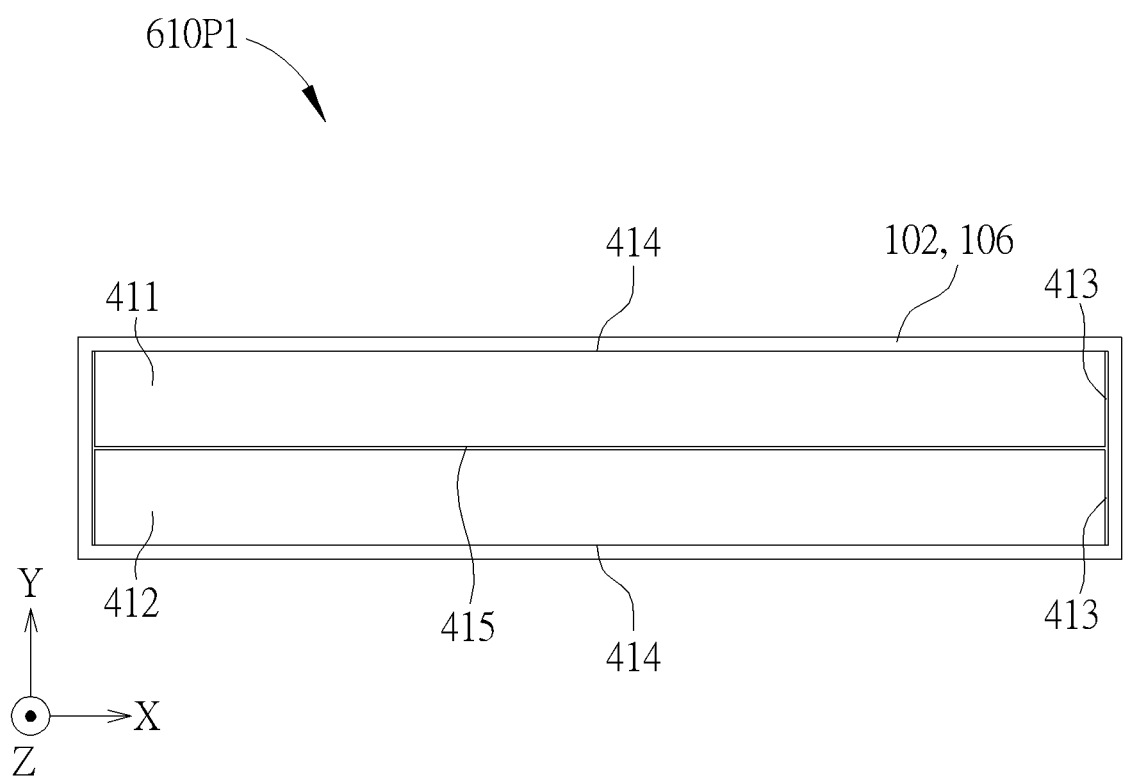

FIG. 6 is a schematic diagram of a top view of a membrane pattern (representing a sound producing cell) 610P1 according to an embodiment of the present application. The membrane pattern 610P1 also represents embodiments of sound producing cells of the present application.

A membrane (e.g., the membrane 110M) within the sound producing cell 610P1 may be divided into two membrane subparts 411 and 412 to form the membrane pattern 610P1 having reflection symmetry. The membrane subparts 411, 412 may swing upwards/downwards as the flaps/leaves of a bascule bridge according to the driving signal (e.g., the driving signals S110) applied to the actuator(s) (e.g., the actuator 110T) on the membrane. In an embodiment, the membrane subparts 411, 412 may move up and down in the Z direction synchronously to avoid big gap(s) disjointing between the membrane subparts 411, 412 from being formed. In another embodiment, the membrane subparts 411, 412 may be actuated to move toward the same direction.

The membrane pattern 610P1 may have the highest degrees of freedom than any of the membrane patterns 310-330 because each of the membrane subparts 411, 412 of the membrane (e.g., the membrane 110M) is attached/anchored only on one (anchored) edge 414 and all the other (three) edges of the membrane subpart 411 or 412 are unbounded, resulting in the least constraint on the Z-direction membrane movement. Since the membrane subparts 411, 412 are able to move along the slit openings/segments 413 and 415 freely, the membrane pattern 610P1 has high degrees of freedom in membrane movement.

In an embodiment, the width of the slit openings/segments 413, 415 (or the slit segments 313, 311, 312 shown in FIG. 5), which may be nonparallel to one another, may be kept as small as possible, generally around 1 micrometer (μm) or narrower to minimize air leakage.

From FIG. 6, only one edge, i.e., the edge 414, of the membrane subpart 411/412 is anchored, and other edges of each of the membrane subpart 411/412 are released. The slit segment 415 is formed between the membrane subpart 411 and the membrane subpart 412, parallel to the long edges of membrane subpart 411/412. The slit segments 413 coincide with membrane boundary along the short edges of membrane subparts 411/412.

In an embodiment, a length of the anchored edge 414 and a length of the slit segment 415 are the same or substantially the same. In an embodiment, the length of slit segments 413 of membrane subpart 411 substantially equals that of membrane subpart 412.

Figure 7:
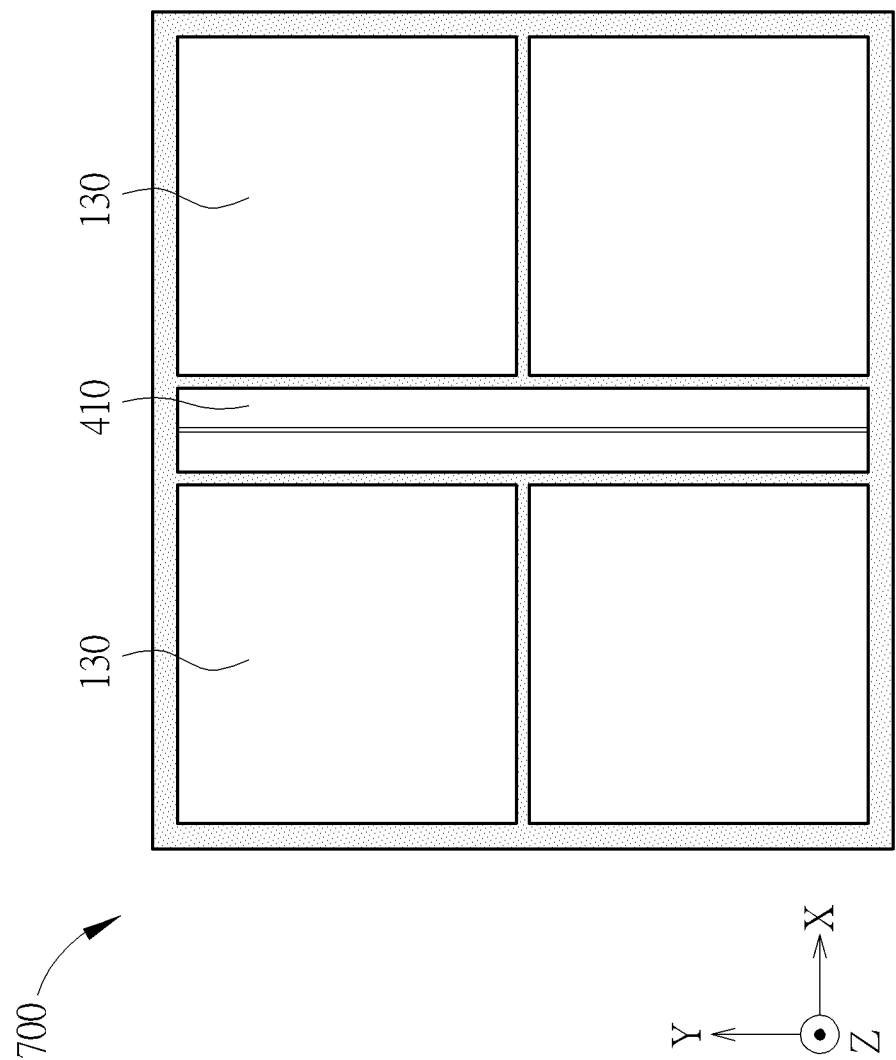
FIG. 7 is a schematic diagram illustrating a top view of a cell array according to an embodiment of the present application.

The number or arrangement of cells may be adjusted according to different design requirements. For instance, FIG. 7 is a schematic diagram illustrating a top view of a sound generating/producing cell array 700 according to an embodiment of the present application. The cell array 700 may include one sound producing (tweeter) cell 410, receiving driving signal S110, and four (woofer) cells 130, surrounding the tweeter cell 410. The cell 410 may adopt the membrane pattern 610P1 shown in FIG. 6, while woofer cells 130 may adopt membrane pattern such as 330 or 320 shown in FIG. 5 or other membrane pattern suitable for producing low frequency sound.

Note that, the short side of the sound producing (tweeter) cell 410 may be beneficial for obtaining higher resonant frequency, and the long side of the sound producing (tweeter) cell 410 may be beneficial for enlarging SPL. In other words, the cell 410 with large aspect ratio, a ratio of a length of the long side thereof with respect to a length of the short side, may achieve both higher resonant frequency and the larger SPL, compared to the cell with less aspect ratio. In addition, the tweeter cell 410 with high aspect ratio may help reducing an area of the cell array 700. The aspect ratio for the tweeter cell may depend on practical requirement. As long as the aspect ratio is larger than 2, the requirement of the present application is satisfied, which is within the scope of the present application.

In addition, the structure of a crossover circuit may be adjusted according to different design requirements. In an embodiment, the crossover circuit 190 or 290 shown in FIG. 1 or 2 may perform a DSP function as a BiQuad infinite impulse response (IIR) filter. In an embodiment, the crossover circuit 190 or 290 may be the 4th-order (or the 6th-order) Linkwitz-Riley (LR-4 or LR-6) which may be implemented by cascading simplified BiQuad filters to perform the LPF and HPF functions. In an embodiment, a BiQuad filter may be the Direct form 2 of a BiQuad filter, which includes 5 multiplication operations, 4 addition operations and 2 registers per stage. In an embodiment, a low-pass BiQuad IIR filter may be implemented by suitable alternatives such as those introduced in U.S. provisional application No. 63/079,680, which is incorporated herein by reference, with 6 addition operations and 2 registers per stage without any multiplication, where the register(s) serve/function as storage unit(s)/circuit(s), and one register may represent one storage unit/circuit. In other words, it requires a total of 12 addition operations to implement the LPF portion of a LR-4 crossover circuit 190 or 290 with the crossover frequency fcx of 1,439.24 Hz at 48 Ksps (kilo sample per second), or 2,878.5 Hz at 96 Ksps, and this LPF portion of the crossover circuit (or filter(s) therein) may comprise no multiplication circuit.

Figure 8:
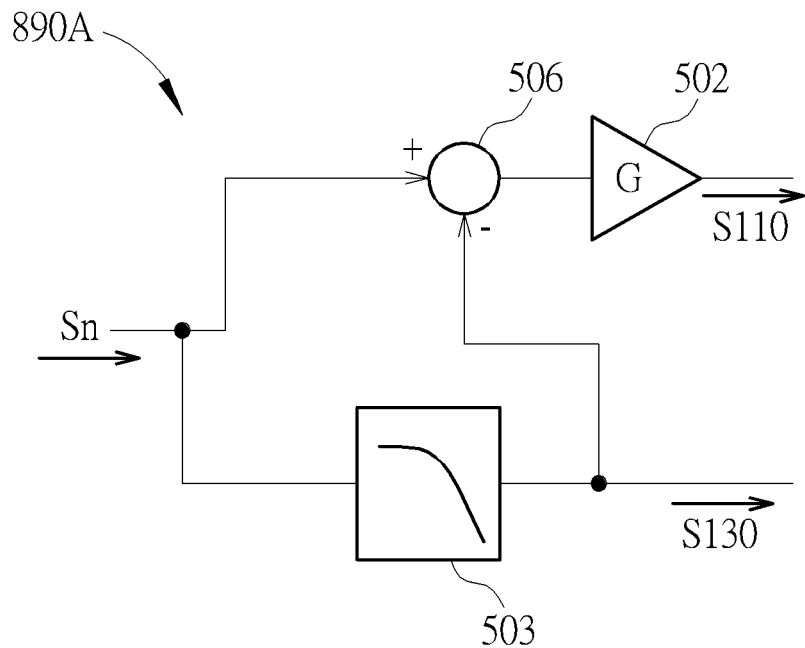
FIG. 8 is a schematic diagram of a crossover circuit according to an embodiment of the present application.
Figure 8:
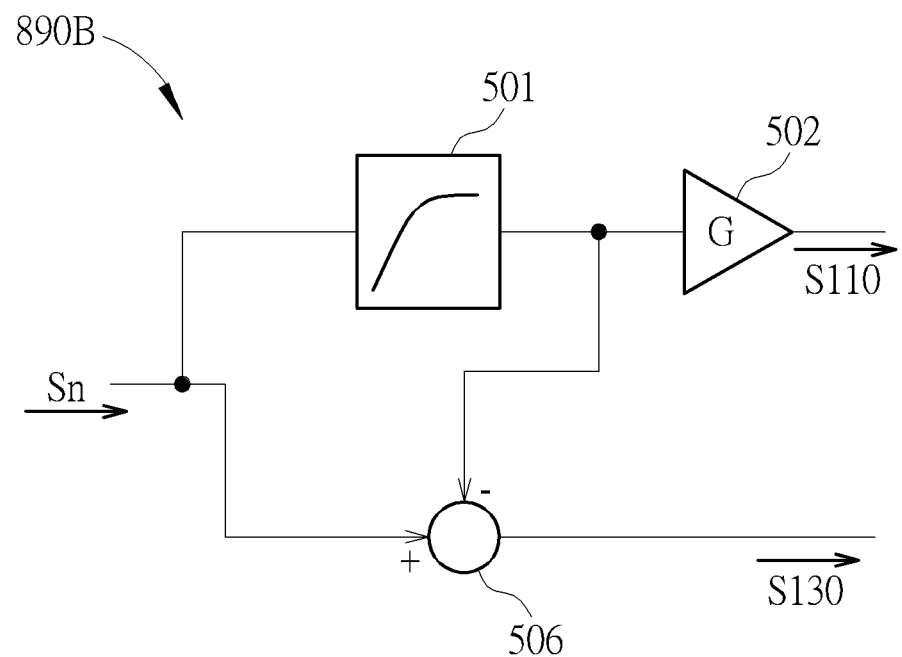

To further adjust the structure of the crossover circuit 290, it is noteworthy that, for a LR-4 cross-over network, except a 360° phase shift between S110 and S130, the sum of the output of the HPF 501 (signal S110) and the output of the LPF 503 (signal S130) equals the input signal Sn, achieving a unit sum. In present application, two alternatives to achieve the objective of unity sum are illustrated in FIG. 8 by schematic diagrams of crossover circuits 890A and 890B.

The crossover circuit 890A shown in FIG. 8a may include the LPF 503 configured to output the driving signal S130 for the (woofer) cell 130, while replacing the HPF 501 of FIG. 2 by the subtraction circuit (or subtracter/subtractor) 506 of the crossover circuit 890A. The subtraction circuit 506 is configured to deduct the driving signal S130 from the input signal Sn to obtain a signal corresponding to the driving signal S110 for the cell 110. In other words, the equation $V_{HPF}$=Vin−$V_{LPF}$ (or equivalently $V_{HPF}$+$V_{LPF}$=Vin) is satisfied, where $V_{HPF}$, $V_{LPF}$, Vin represent the voltage of the driving signal S110, signals S130 and the input signal Sn respectively. By passing the driving signal S130 through the LPF 503 and outputting higher audio band corresponding to the driving signal S110 from the subtraction circuit 506, the crossover circuit 890A also features the unity sum as the crossover circuit 290 shown in FIG. 2.

As can be seen above, the crossover circuit 890A may require only 12 (i.e., 6×2=12 for the LPF 503) addition operations to perform the LPF function of a LR-4 cross-over network and one subtraction operation (of 506) to perform the HPF function (to output the driving signal S110), thereby greatly simplifying the computation.

Further note that, except for the delay of the subtracter 506, the sum of signal S130 and signal S110 equals the input signal Sn (namely, $V_{HPF}$+$V_{LPF}$=Vin), there is no phase difference between the sum of the output of the crossover circuit 890A (namely, the sum of driving signals S130 and S110) and the input signal Sn, i.e., S110+S130=Sn. This Zero-phase-shift feature is greatly beneficial to active-noise cancelling (ANC), as any delay can lead to phase misalignment and degrade the efficacy of an ANC circuit. Specifically, in the field of ANC, the phase response is as critical as the amplitude response, and a flat amplitude response alone is not enough to achieve high level noise cancelling. ANC may be perfectly achieved through the use of the crossover circuit 890A, which not only exhibits flat amplitude response over the entire frequency range but also ensures zero phase shift, or ensures that a phase shift of a summation signal S110+S130 with respect to the input signal Sn is less than, e.g., 10° and achieves a phase delay of the aggregated sound P110+P130 with respect to the input signal Sn of less than 25°.

Because of the generality of the equation $V_{HPF}$+$V_{LPF}$=Vin, the LPF 503 in the crossover circuit 890A is not limited to LR4. Arbitrary low-pass filters may be used to satisfy the specific objective(s) for different system designs. For example, a 6th order or 8-th order LPF may be adopted to produce sharper cutoff rate (namely, steeper frequency response slope) for the cell 130. By virtue of the generality of the equation $V_{HPF}$+$V_{LPF}$=Vin, the sharper frequency response cutoff rate corresponding to the LPF 503 will be imprinted in the driving signal S110 for the cell 110, while the combined output of the crossover circuit 890A for the cells 110 and 130 will always be equal to and always have zero-phase-shift relative to the input signal Sn.

The embodiment of circuit 890A may be either analog or digital. In analog embodiment, LPF 503 may be implemented by a multi-stage operational amplifier and the subtraction function of 506 may be implemented as a difference amplifier or as part of the input stage circuit topology of amplifier 502. In digital embodiment, LPF 503 may be implemented as a BiQuad filter, such as those discussed in U.S. provisional application No. 63/079,680 and the subtractor 506 may be implements as combination logic gates to minimize the delay. The detail of such circuit is well documented in the field of operational amplifier design and/or digital circuit design and will be omitted herein for brevity.

Alternative to 890A, the crossover circuit 890B shown in FIG. 8b may include the HPF 501 configured to output the driving signal S110 for the cell 110, but the LPF 503 shown in FIG. 2 is replaced with the subtraction circuit 506 of the crossover circuit 890B.

Given the zero-phase-shift contributed by either of the crossover circuits shown in FIG. 8, as well as the near-zero-phase lag of MEMS sound producing cells shown in the above, the SPD in the present application may be applied to wearable hearing device with ANC capability.

Figure 9:
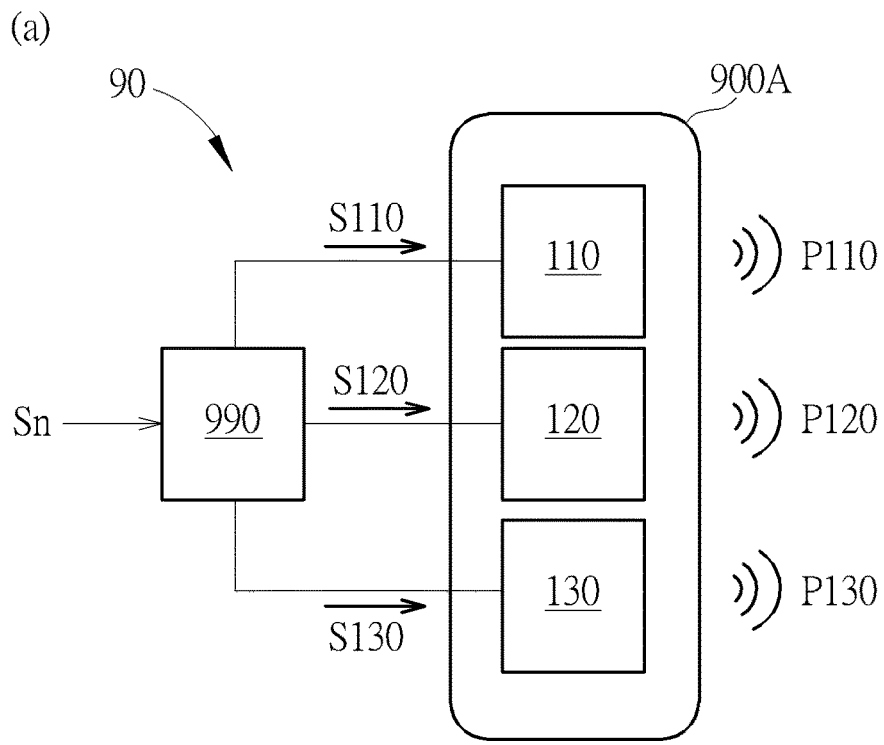
FIG. 9 is a schematic diagram of an SPD according to an embodiment of the present application.
Figure 9:
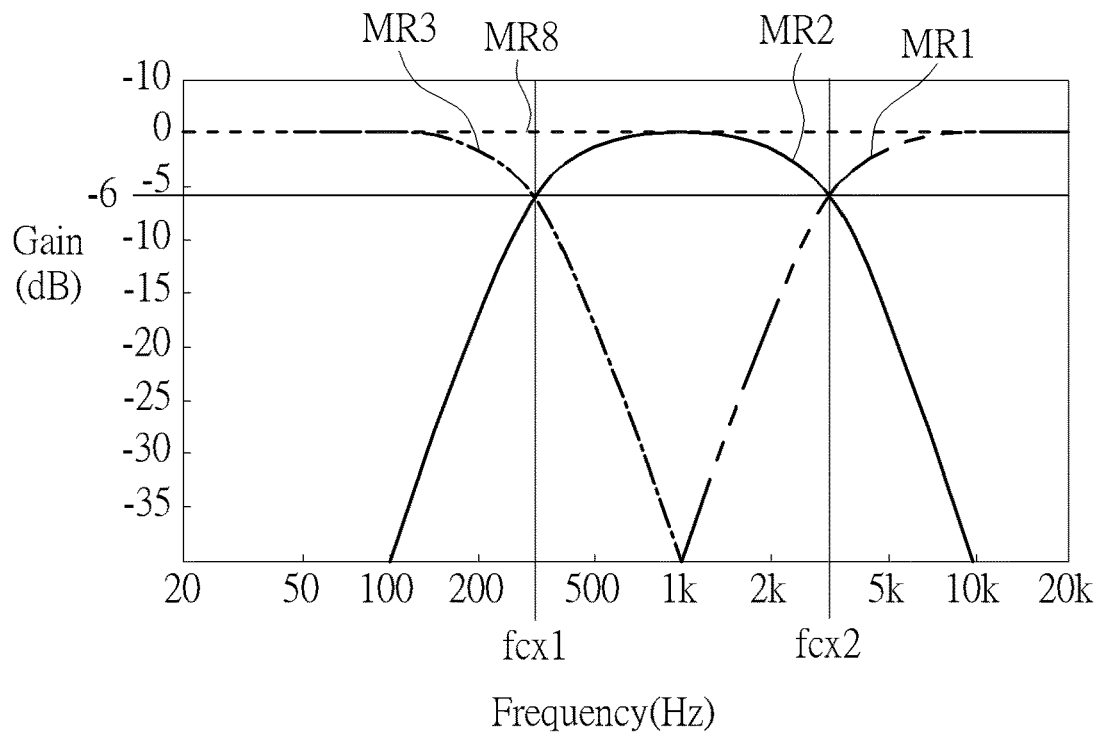

Cells in a cell array may be divided into more than two types. For instance, FIG. 9 is a schematic diagram of a 3-way SPD 90 according to an embodiment of the present application. FIG. 9a illustrates the structure of the SPD 90. FIG. 9b illustrates the frequency response corresponding to a crossover circuit 990 of the SPD 90.

Figure 10:
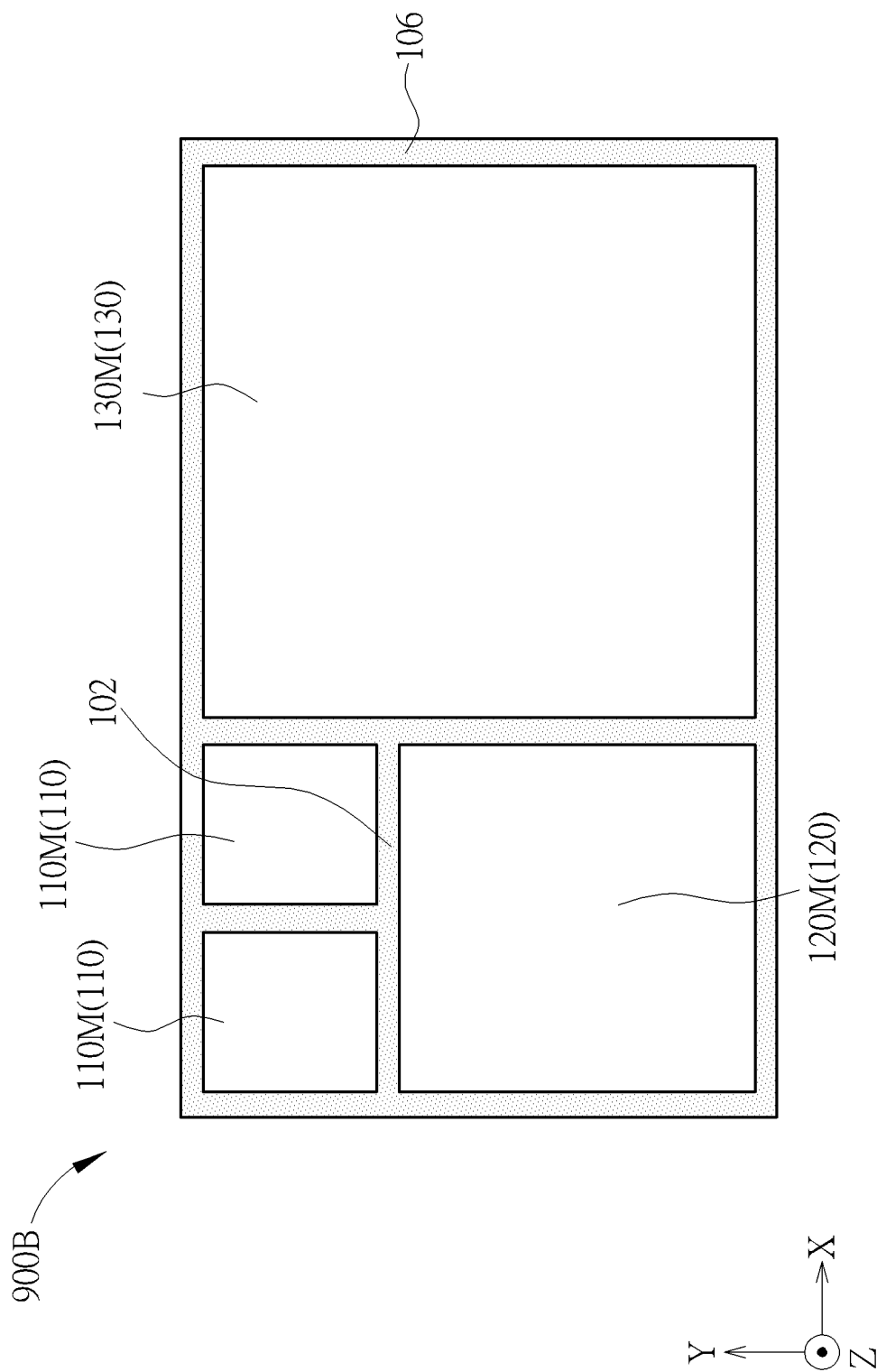
FIG. 10 is a schematic diagram illustrating a top view of a cell array according to an embodiment of the present application.

A sound generating/producing cell array 900A of the SPD 90 may include the cells 110, 130 and 120 of different types. For example, FIG. 10 is a schematic diagram illustrating a top view of a sound generating/producing cell array 900B according to an embodiment of the present application. The cell array 900A shown in FIG. 9 may be implemented as the cell array 900B. The cell array 900B includes two tweeter cells 110 covering the frequency band corresponding to MR1 and producing sound/pressure P110, one woofer cell 130 covering the frequency band corresponding to MR3 and producing sound/pressure P130, and one mid-range cell 120 covering the frequency band corresponding to MR2 and producing sound/pressure P120.

Similarly, the midrange sound producing cell 120 is configured to produce the acoustic sound P120 on a third audio band different from the first audio band and the second audio band. The third audio band corresponding to the driving signal S120 is upper bounded by a maximum frequency $f_{max,S120}$. A resonance frequency $f_{r,120}$ of a membrane 120M within the mid-range cell 120 is higher than the maximum frequency $f_{max,S120}$.

In an embodiment, the cell 120 may function as a mid-range driver to cover midrange frequency. The area of the membrane 120M (within the mid-range cell 120) is larger than that of the membrane 110M (within the tweeter cell 110) and smaller than that of the membrane 130M (within the woofer cell 110), while the resonance frequency of the (mid-range) membrane 120M may be lower than that of the (tweeter) membrane 110M and higher than that of the (woofer) membrane 130M. In an embodiment, the resonance frequency of the (mid-range) cell 120 may be significantly higher than a crossover frequency fcx2 between the driving signal S120 and driving signal S110 (which would be elaborated later). In practice, a crossover frequency fcx1, between audio bands corresponding to MR3 and MR2, may be in a range of 300 Hz~1 KHz, while the crossover frequency fcx2, between audio bands corresponding to MR1 and MR2 may be in a range of 2 KHz to 6 KHz.

In an embodiment, the cells 110, 120, 130 may be made of a Silicon-On-Insulator (SOI) or Poly-On-Insulator (POI) wafer; a Si layer or Poly layer forms the membranes 110M, 120M, 130M; a Si substrate of the SOI or POI wafer forms a cell-to-cell partition wall 102 and an overall chip border wall 106. In an embodiment, the cells 110, 120, 130 may be fabricated out of a monolithic silicon substrate and may be integrally formed, such that the cells 110, 120, 130 are formed with the same material and their connection has no mechanical joints.

The crossover circuit 990 shown in FIG. 9 is configured to partition the input signal Sn into three driving signals S110, S120, S130 and transmitted toward the cells 110, 120, 130, respectively. The crossover circuit 990 may be required to perform a low-pass filtering operation, a band-pass filtering operation and a high-pass filtering operation, to generate the driving signal S130, S120 and S110, respectively, according to the input signal Sn. In an embodiment, the crossover circuit 990 may include the HPF 501 (to perform the high-pass filtering operation), the LPF 503 (to perform the low-pass filtering operation), and a band-pass filter for the cell 120.

Figure 11:
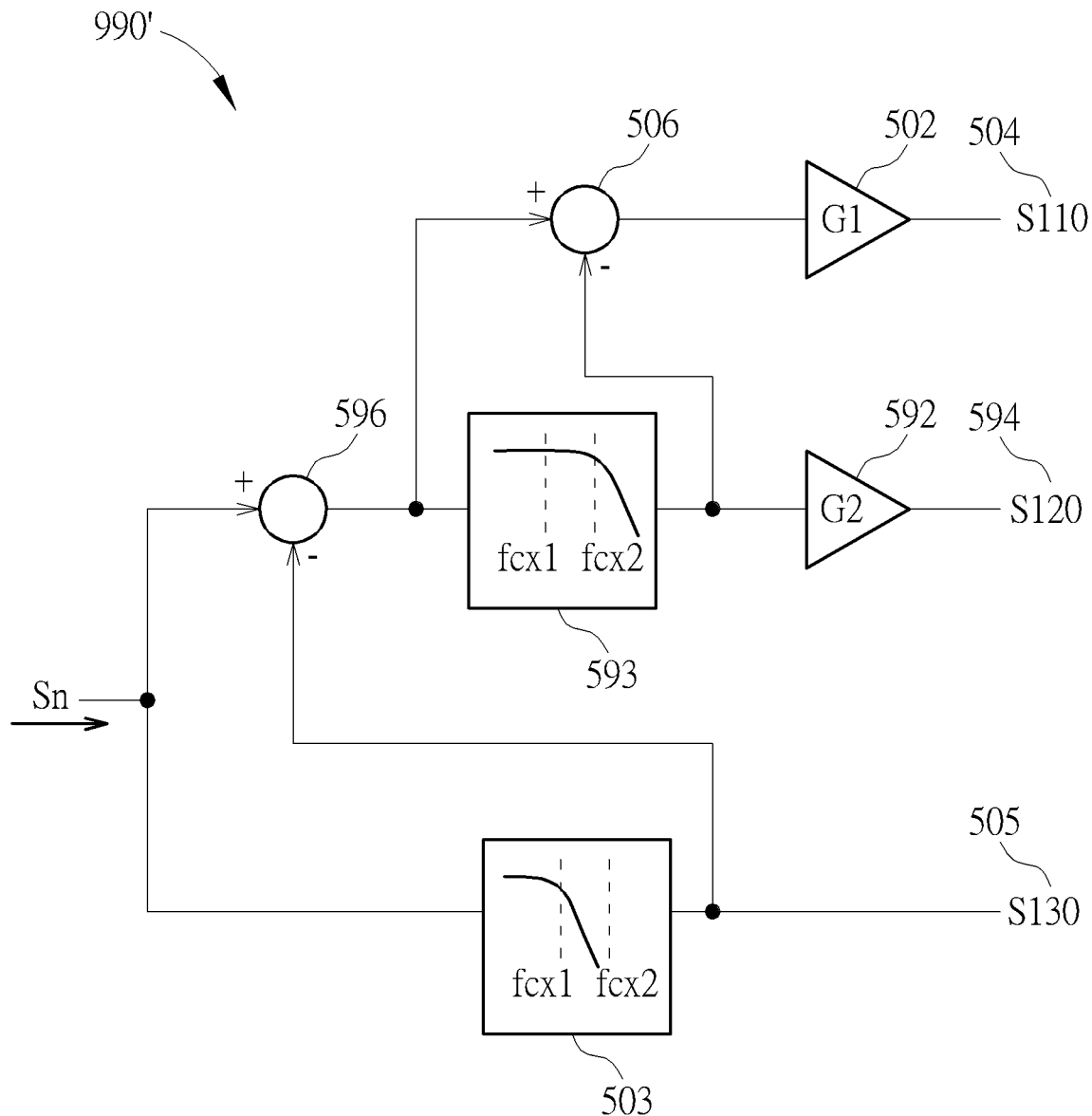
FIG. 11 is a schematic diagram of a crossover circuit according to an embodiment of the present application.

In another embodiment, in order to reduce the phase lag/shift or to achieve zero-phase-shift, subtractors may be included to perform the filtering operation(s). As shown in FIG. 11, in which a crossover circuit 990' is illustrated. The crossover circuit 990' comprises LPFs 503, 593, and subtractors 506, 596. The LPF 503 may have a cutoff frequency at fcx1, and the LPF 593 may have a cutoff frequency at fcx2. In the current embodiment, fcx2>fcx1. A positive input terminal of the subtractor 596, annotated as "+", is connected to the input terminal of the LPF 503; a positive input terminal of the subtractor 506, annotated as "+", is connected to the input terminal of the LPF 593; a negative input terminal of the subtractor 596, annotated as "−", is connected to the output terminal of the LPF 503; a negative input terminal of the subtractor 506, annotated as "−", is connected to the output terminal of the LPF 593. The input terminal of the LPF 503 receives the input signal Sn.

The function of the band-pass filtering operation is performed by taking the output signal from LPF 503, connecting it to the negative input terminal of the subtractor 596 to subtract it (i.e., the output signal of LPF 503) from the input signal of LPF 503, i.e., Sn, and performing low-pass filtering operation on the resulting signal (produced by the subtractor 596) by an LPF 593. The function of HPF 501 (or high-pass filtering operation) is performed by taking the output signal from the LPF 593, connecting it to the negative input terminal of the subtractor 506 to subtract it from the input signal of LPF 593.

When G1=G2=1 for sensitivity compensation blocks 502, 592, the sum of output signals of the crossover circuit 990', expressed as S110+S120+S130, will automatically possess the characteristics of unity-sum, flatness over the entire frequency range, and zero-phase-shift. That is, S110+S120+S130=Sn (when G1=G2=1). In addition, the crossover between MR3 and MR2 (at fcx1) will fall on the frequency where both MR3 and MR2 have decayed by 6 dB automatically; the crossover between MR1 and MR2 (at fcx2) will fall on the frequency where both MR1 and MR2 have decayed by 6 dB automatically. The frequencies fcx1, fcx2 may be regarded as crossover frequencies of the crossover circuit 990'. In an embodiment, $fcx1 < f_{r,130} < fcx2 < f_{r,120} < f_{max,S110} < f_{r,110}$, where $f_{r,120}$ denotes a resonant frequency of the membrane 120M.

In an embodiment, the input signal Sn may be in pulse-code modulation (PCM) format at 48 Ksps (kilo samples per second) or 96 Ksps sample rate.

In one aspect of the present invention, by partition the input signal Sn into multiple frequency bands, the resonance frequency of a membrane (e.g., the membrane 120M or 130M) may be lowered while the maximum input frequency (namely, the maximum frequency of the driving signal S120 or S130) is significantly lower than the resonance frequency of the membrane as disclosed in U.S. provisional application No. 62/897,365 and/or U.S. Pat. No. 10,805,751. Therefore, the present invention may have lower membrane stiffness, increased membrane compliance, more effective membrane design, improved unit silicon area sound generating efficacy of the cells (e.g., the cells 120 and 130) without sacrificing the quality of the sound or the consistency of production following the design principle disclosed in U.S. provisional application No. 62/897,365 and/or U.S. Pat. No. 10,805,751.

In another aspect of the present invention, by partition the input signal Sn into multiple frequency bands, the membrane leakage through slit(s) constituting a membrane pattern (e.g., the membrane pattern 310) may be mitigated for a cell (e.g., the cell 110) not responsible for producing lower registers of sound. Therefore, more efficient membrane design may be applied, resulting in improved unit silicon area sound generating efficacy of the cells (e.g., the cells 120 and 130).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sound producing device, abbreviated as SPD, comprising:
    a first sound producing cell comprising a first membrane, driven by a first driving signal, configured to produce a first acoustic sound on a first audio band; and
    a second sound producing cell comprising a second membrane, driven by a second driving signal, configured to produce a second acoustic sound on a second audio band different from the first audio band;
    wherein the first membrane and the second membrane are Micro Electro Mechanical System, abbreviated as MEMS, fabricated membranes;
    wherein the first audio band corresponding to the first driving signal is upper bounded by a first maximum frequency, and the second audio band corresponding to the second driving signal is upper bounded by a second maximum frequency;
    wherein a first resonance frequency of the first membrane is higher than the first maximum frequency of the first driving signal;
    wherein a second resonance frequency of the second membrane is higher than the second maximum frequency of the second driving signal.

2. The SPD of claim 1, comprising:
    a crossover circuit, coupled to the first membrane and the second membrane, configured to generate the first driving signal and the second driving signal, wherein the crossover circuit has a crossover frequency;

wherein the first resonance frequency is higher than the second resonance frequency, and the second resonance frequency is higher than the crossover frequency.

3. The SPD of claim 1, wherein the first maximum frequency is higher than the second resonance frequency.

4. The SPD of claim 1, wherein a first area of the first membrane is different from a second area of the second membrane, such that the first resonance frequency is higher than the second resonance frequency.

5. The SPD of claim 1, wherein a first membrane pattern of the first sound producing cell is different from a second membrane pattern of the second sound producing cell, such that the first resonance frequency is higher than the second resonance frequency.

6. The SPD of claim 1, wherein a first membrane pattern of the first sound producing cell has different degrees of freedom from a second membrane pattern of the second sound producing cell, such that the first resonance frequency is higher than the second resonance frequency.

7. The SPD of claim 1, wherein a first membrane stiffness of the first sound producing cell is different from a second membrane stiffness of the second sound producing cell, such that the first resonance frequency is higher than the second resonance frequency.

8. The SPD of claim 1, wherein a first membrane pattern of the first sound producing cell includes at least one slit segment disposed along at least one outermost edge of the first sound producing cell.

9. The SPD of claim 1, wherein a first membrane pattern of the first sound producing cell includes a plurality of membrane subparts separated from one another.

10. The SPD of claim 1, comprising a crossover circuit, coupled to the first membrane and the second membrane, configured to generate the first driving signal and the second driving signal, wherein the crossover circuit comprises:
a first filter, wherein the crossover circuit generates one driving signal of the first and second driving signals according to a first output signal of the first filter.

11. The SPD of claim 10, wherein the crossover circuit comprises:
a second filter, wherein the crossover circuit generates another driving signal of the first and second driving signals, other than the one driving signal generated according to the first output signal, according to a second output signal of the second filter.

12. The SPD of claim 10, wherein the crossover circuit comprises a gain circuit, the gain circuit is coupled to the first sound producing cell and configured to compensate a sensitivity difference between the first sound producing cell and the second sound producing cell.

13. The SPD of claim 10, wherein the first filter comprises storage units and adders to perform filter coefficient multiplications, and the first filters comprises no multiplication circuit.

14. The SPD of claim 10, wherein the crossover circuit comprises:
a subtraction circuit, wherein an input terminal of the first filter is coupled to a first input terminal of the subtraction circuit, an output terminal of the first filter is coupled to a second input terminal of the subtraction circuit;
wherein the crossover circuit generates another driving signal of the first and second driving signals, other than the one driving signal generated according to the first output signal, according to a second output signal of the subtraction circuit.

15. The SPD of claim 1, further comprising:
a third sound producing cell comprising a third membrane, coupled to a crossover circuit and driven by a third driving signal generated by the crossover circuit, configured to produce a third acoustic sound on a third audio band different from the first audio band and the second audio band;
wherein the third audio band corresponding to the third driving signal is upper bounded by a third maximum frequency;
wherein a third resonance frequency of the third membrane is higher than the third maximum frequency.

16. The SPD of claim 15, wherein the third resonance frequency is higher than the second resonance frequency and lower than the first resonance frequency.

17. The SPD of claim 1, comprising a crossover circuit, configured to generate the first driving signal for the first sound producing cell and the second driving signal for the second sound producing cell, wherein the crossover circuit comprises a Linkwitz-Riley crossover filter.

18. The SPD of claim 1, wherein a first maximum SPL requirement of the first sound producing cell is lower than a second maximum SPL requirement of the second sound producing cell when the SPD functions as an in-ear monitor speaker.

19. The SPD of claim 1, wherein
an aggregated sound produced by the SPD comprises the first acoustic sound and the second acoustic sound;
the SPD produces the aggregated sound according to an input signal;
a phase shift of the aggregated sound with respect to the input signal is less than 25°.

20. The SPD of claim 1, wherein
a summation signal is formed by a summation of the first driving signal and the second driving signal;
the SPD generates the first driving signal and the second driving signal according to an input signal;
a phase shift of the summation signal with respect to the input signal is less than 20°.

21. The SPD of claim 1, wherein the SPD is disposed within a wearable hearing device.

22. The SPD of claim 21, wherein the wearable hearing device comprises an active noise cancellation capability.

23. A crossover circuit, disposed within a sound producing device, abbreviated as SPD, wherein the SPD comprises a first sound producing cell driven by a first driving signal and a second sound producing cell driven by a second driving signal, the crossover circuit comprising:
a first filter, receiving an input signal at an input terminal of the first filter; and
a first subtraction circuit, wherein a first input terminal of the first subtraction circuit is coupled to the input terminal of the first filter, a second input terminal of the first subtraction circuit is coupled to an output terminal of the first filter;
wherein the crossover circuit produces the first driving signal according to a first output signal of the first subtraction circuit;
wherein the crossover circuit produces the second driving signal according to a second output signal of the first filter.

24. The crossover circuit of claim 23, wherein
a summation signal is formed by a summation of the first driving signal and the second driving signal;
a phase shift of the summation signal with respect to the input signal is less than 20°;

the first sound producing cell produces a first acoustic sound;

the second sound producing cell produces a second acoustic sound;

an aggregated sound produced by the SPD comprises the first acoustic sound and the second acoustic sound;

a phase shift of the aggregated sound with respect to the input signal is less than 25°.

25. The crossover circuit of claim 23, wherein the SPD comprises a third sound producing cell driven by a third driving signal, the crossover circuit further comprises:
   a second filter, receiving the first output signal of the first subtraction circuit; and
   a second subtraction circuit, wherein a first input terminal of the second subtraction circuit is coupled to an input terminal of the second filter, a second input terminal of the second subtraction circuit is coupled to an output terminal of the second filter;
   wherein the crossover circuit produces the first driving signal according to a third output signal of the second filter;
   wherein the crossover circuit produces the third driving signal according to a fourth output signal of the second subtraction circuit.

26. The crossover circuit of claim 23, further comprising a gain amplifier, coupled to an output terminal of the first subtraction circuit, configured to generate the first driving signal.

27. A sound producing cell, comprising:
   a membrane comprising a first membrane subpart and a second membrane subpart;
   wherein only one edge of each of the first membrane subpart and the second membrane subpart is anchored, and other edges of each of the first membrane subpart and the second membrane subpart are released;
   wherein an aspect ratio of the sound producing cell is larger than 2, the aspect ratio of the sound producing cell is a ratio of a first length of a long side of the sound producing cell to a second length of a short side of the sound producing cell.

28. The sound producing cell of claim 27, wherein a first slit segment is formed between long released edges of the first membrane subpart and the second membrane subpart, a second slit segment is formed by short released edges of the first membrane subpart and the second membrane subpart.

29. The sound producing cell of claim 28, wherein a length of the anchored edge and a length of the first slit segment are substantially the same.

30. The sound producing cell of claim 27, wherein the first membrane subpart and the second membrane subpart are actuated to move toward the same direction.

* * * * *